United States Patent
Berezdivin et al.

(10) Patent No.: US 6,847,678 B2
(45) Date of Patent: Jan. 25, 2005

(54) ADAPTIVE AIR INTERFACE WAVEFORM

(75) Inventors: Roberto Berezdivin, Great Falls, VA (US); Robert J. Breinig, Fairfax, VA (US); Allan R. Topp, Montclair, VA (US); Scott Y. Seidel, Fairfax, VA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 10/421,168

(22) Filed: Apr. 22, 2003

(65) Prior Publication Data

US 2003/0203721 A1 Oct. 30, 2003

Related U.S. Application Data

(60) Provisional application No. 60/375,855, filed on Apr. 25, 2002.

(51) Int. Cl.[7] .......................... H04B 1/707; H04B 1/713
(52) U.S. Cl. ...................... 375/146; 375/135; 370/342; 370/344; 370/347
(58) Field of Search ................................. 375/132, 133, 375/135, 136, 138, 140, 141, 146, 147; 370/335, 337, 342, 343, 344, 347, 429, 480, 482, 491

(56) References Cited

U.S. PATENT DOCUMENTS

| | | | | |
|---|---|---|---|---|
| 5,479,447 A | * | 12/1995 | Chow et al. | 375/260 |
| 6,084,919 A | | 7/2000 | Kleider et al. | |
| 6,510,133 B1 | * | 1/2003 | Uesugi | 370/208 |

FOREIGN PATENT DOCUMENTS

WO  WO 02/08864 A2   1/2002

OTHER PUBLICATIONS

PCT Report for PCT/US 03/13065, 8 pages, Aug. 26, 2003.
Chad Bergstrom at al., "Adaptive Spectrum Exploitation Using Emerging Software Defined Ratios", 1999 IEEE Journal, pp. 113–116, 1999.
Qingxin Chen et al., "Multicarrier CDMA with Adaptive Frequency Hopping for Mobile Radio Systems", Dec. 1996 IEEE Journal, vol. 14, No. 9, pp. 1852–1858, Dec. 1996.
Cheong Yui Wong et al., "Multiuser OFDM with Adaptive Subcarrier, Bit, and Power Allocation", Oct. 1999 IEEE Journal, vol. 17, No. 10, pp. 1747–1758, Dec. 1996.
Jiliei Hou et al., "Multilevel Coding with Low–Density Parity–Check Component Codes", 2001 IEEE Journal, pp. 1016–1020, 2001.

* cited by examiner

*Primary Examiner*—Young T. Tse
(74) *Attorney, Agent, or Firm*—Baker Botts L.L.P.

(57) ABSTRACT

In one embodiment, a method for generating an adaptive air interface waveform includes generating a waveform that includes a variable carrier frequency and variable bandwidth signal. The variable bandwidth signal includes one or more subcarriers that are dynamically placeable over a range of frequencies, and each subcarrier is separately modulated according to a direct sequence (DS) spread spectrum (SS) technique. The waveform has an embedded pilot usable to optimize one or more spectrum efficiencies of the waveform. A modulation constellation, a code rate, and a code length of the generated waveform are adapted according to an available spectrum and one or more sub-carrier conditions.

31 Claims, 4 Drawing Sheets

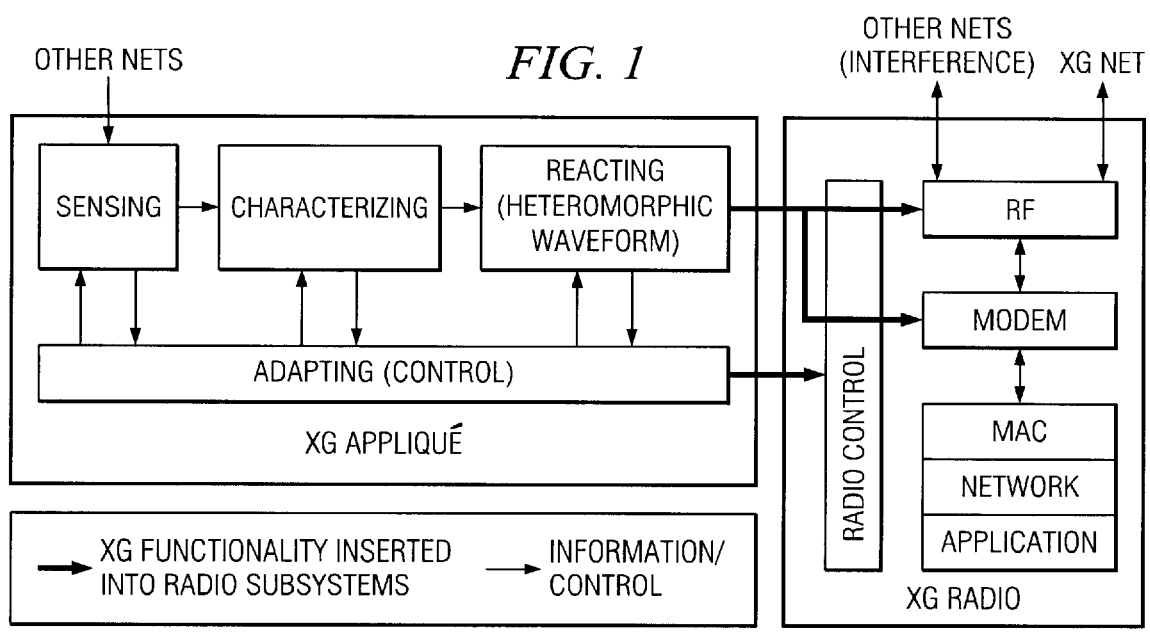
FIG. 1
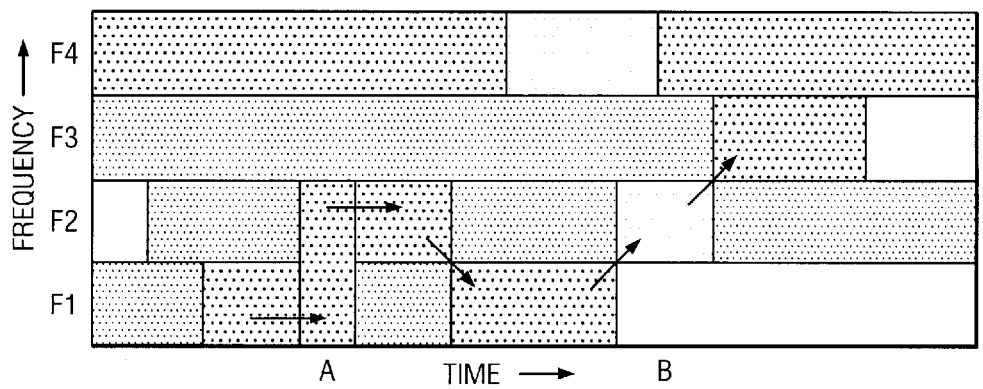
FIG. 2
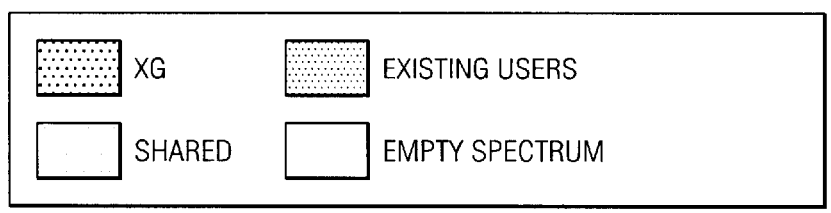

ADAPTIVE AIR INTERFACE WAVEFORM

RELATED APPLICATION

This application claims the benefit, under 35 U.S.C. § 119(e), of U.S. Provisional Application No. 60/375,855, filed Apr. 25, 2002.

TECHNICAL FIELD OF THE INVENTION

This invention relates to wireless communication and more particularly to an adaptive air interface waveform.

BACKGROUND OF THE INVENTION

Current wireless communication systems do not adjust well to dynamic changes in the electromagnetic spectrum. As a result, these systems tend to provide a relatively low quality of service. As demand for high-bandwidth services increases, this problem will likely worsen.

Prior attempts to improve the ability of wireless communication systems to adjust to dynamic changes in the electromagnetic spectrum have focused on adaptation in a subset of dimensions available at a particular point in time. Data rates and processing gains have been modified to adapt specific waveforms, such as spread spectrum modulated signals, to a particular communication link condition. Various error-correction coding techniques with various parameters have been applied to a particular frequency assignment. Frequency adaptation techniques have been used in high frequency (HF) ranges. Frequency adaptation techniques have also been used in communication systems, such as wireless local area networks (WLANs), in which an open frequency is selected after a relatively slow seat for an open frequency.

Cellular communication systems typically operate at assigned channel frequencies. Slow assignments can use frequency division multiple access (FDMA) techniques. Adaptive modulation techniques have been investigated, but have been more or less limited to changing one or more parameters in a particular modulation scheme. Spectrum use can vary considerably throughout the world, which often necessitates a complex spectrum assignment process. Reallocation of bandwidth as a result of growth in commercial wireless markets could necessitate even more complex spectrum assignment processes in the future. In current wireless communication systems, one or more frequencies are statically assigned to a communication and sensor system (such as a radar system) without frequency overlap between the communication and sensor system and one or more other communication and sensor systems and with large spatial separation to prevent harmful interference between the communication and sensor system and one or more other communication and sensor systems.

SUMMARY OF THE INVENTION

Particular embodiments of the present invention may reduce or eliminate disadvantages and problems traditionally associated with wireless communication.

In one embodiment of the present invention, a method for generating an adaptive air interface waveform includes generating a waveform that includes a variable carrier frequency and variable bandwidth signal. The variable bandwidth signal includes one or more subcarriers that are dynamically placeable over a range of frequencies, and each subcarrier is separately modulated according to a direct sequence (DS) spread spectrum (SS) technique. The waveform has an embedded pilot usable to optimize one or more spectrum efficiencies of the waveform. A modulation constellation, a code rate, and a code length of the generated waveform are adapted according to an available spectrum and one or more sub-carrier conditions.

Particular embodiments of the present invention provide one or more advantages. In particular embodiments, dynamic adaptation in multiple parameters provides one or more performance options for wireless communication systems. In particular embodiments, the multiple parameters include adaptation in time, adaptation in power, variable bandwidth, variable data rate, variable modulation and coding, and spatial adaptation.

Particular embodiments provide a waveform that can adapt to an environment in multiple dimensions of available signal space. In particular embodiments, as an example, the signal space includes frequency, time, power, modulation, code, and spatial domain. Particular embodiments provide a waveform and a mechanism for selecting one or more parameters of the waveform and changing the waveform to adapt to one or more communication networks, one or more communication links, or one or more user requirements. Particular embodiments provide intelligent selection of multiple dimensions of an adaptation space, which can include frequency, modulation scheme and related parameters, coding scheme and related parameters, and data rates. Particular embodiments can provide a waveform optimized according to one or more link conditions. In particular embodiments, a modulation scheme can form multiple constellations and spatially adapt to transmission times. In particular embodiments, modulation uses a multi-carrier code division multiple access (MC-CDMA) scheme according to which one or more individual carriers are independently modulated and coded according to the adaptation of the individual carriers to one or more communication links. In particular embodiments, adaptation to a communication link is more or less subject to one or more requirements associated with changes in data rates and frequency over time. In particular embodiments, one or more frequencies can be blocked or emphasized (effectively providing power control at each frequency), which can enable use of noncontiguous frequency sub-bands. In particular embodiments, a particular modulation and coding scheme is selected for a particular sub-band. In particular embodiments, a heteromorphic waveform can be morphed to one or more wireless communication resources (such as one or more frequency bands). In particular embodiments, frequency, modulation type and related parameter, coding type and related parameter, time, space, power, bandwidth, and processing are analyzed to provide relatively fast adaptation to time-varying channel conditions.

Particular embodiments provide an adaptable waveform for multiple wireless applications, such as applications for selecting multiple dimensions of an adaptation space and applications for estimating channel characteristics. In particular embodiments, power is controlled at frequencies in a waveform. In particular embodiments, noncontiguous frequency sub-bands are generated. In particular embodiments, a preferred channel organization is identified and selected. In particular embodiments, a preferred modulation and coding technique is selected according to one or more requirements associated with data rate and quality of service.

In particular embodiments, a spectrum-aware heteromorphic waveform that dynamically adapts to use available holes in a spectrum defined by frequency, space, and time enables shared use of common spectra. In particular embodiments, simultaneous adaptation of multiple waveform parameters enables more or less assured communication, while suppressing mutual harmful interference. Particular embodiments provide dynamic spectral assignment techniques that increase spectrum utilization by a factor of twenty.

Particular embodiments provide quick-response adaptive multi-carrier reorganization using one or more suitable available frequencies. Particular embodiments provide a signal design that includes a pilot for real-time sub-carrier channel estimation to more or less optimize waveform parameters and includes fast signal acquisition for transmission bursts. Particular embodiments provide one or more adaptive bandwidth-efficient code-modulation schemes with more or less simultaneous multi-dimensional variability with respect to multiple sub-carriers. Particular embodiments provide fast-reaction capability to quickly release channel usage and dynamically reconfigure hybrid multiple-access techniques.

Particular embodiments provide a single adaptable waveform that can work in multiple applications, such as WLAN applications and cellular applications. Particular embodiments provide a useful air interface that works in heterogeneous networks and can operate at data rates ranging from approximately 100 Mbps to 1 Gbps. A network environment could include a cellular macro environment, a micro-pico cellular environment, a WLAN or similar environment. A network environment could include one or more flexible architectures, such as cellular, centralized, ad hoc, and hybrid architectures. Particular embodiments support services and applications that have relatively high rates of data transmission. Particular embodiments automatically operate in gaps (or holes) in spectrum use. A hole can include multiple dimensions, such as time, frequency, and space.

BRIEF DESCRIPTION OF THE DRAWINGS

To provide a more complete understanding of the present invention and the features and advantages thereof, reference is made to the following description, taken in conjunction with the accompanying drawings, in which:

FIG. 1 is a block diagram of a heteromorphic waveform function in accordance with the present invention within a next generation (XG) appliqué;

FIG. 2 is an illustration of a frequency agile heteromorphic waveform adapting to fill available time-frequency spectrum gaps;

DESCRIPTION OF EXEMPLARY EMBODIMENTS

Figure 3:
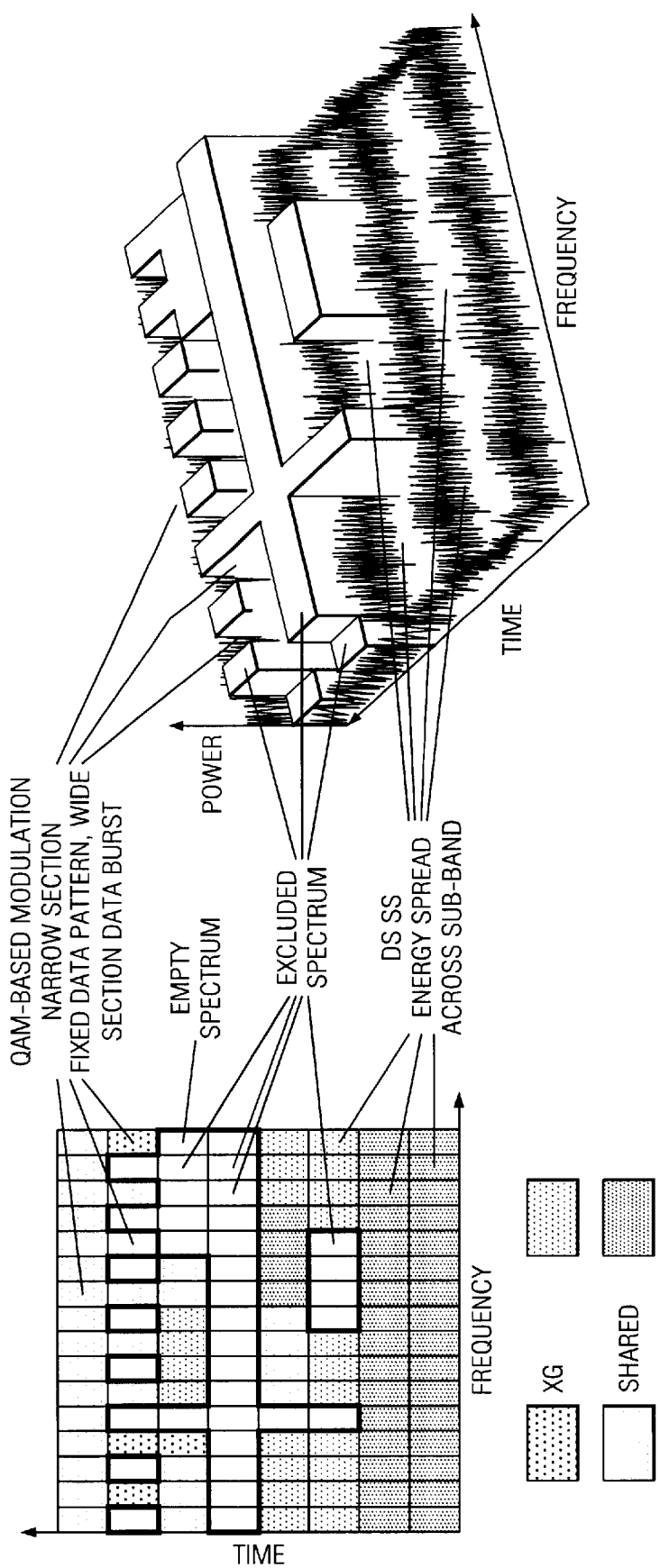
FIG. 3 is an illustration of a heteromorphic waveform adapting to multiple variables to optimize spectral efficiency.

The present invention is a heteromorphic waveform that dynamically adapts in frequency, time, modulation, code, data rate, power, signaling, and multi-carrier organization. The waveform will increase spectral efficiency by enabling efficient, opportunistic and cooperative spectrum use. It reacts to time-varying channel and use conditions by seizing time/frequency/spatial "holes" and using the most efficient coding, modulation, signaling and multi-carrier organization consistent with non-interfering communications. The heteromorphic waveform of the invention is subdivided into two major components as follows:

Adaptive Multi-Carrier Organization and Signaling configures a variable carrier frequency and variable bandwidth signal into one or many sub-carriers that are dynamically placed over a span of up to 250 MHz to avoid or minimize interference with transmissions of existing spectrum users. Each sub-carrier is independently modulated by direct sequence spread-spectrum (DS SS) for variable spreading and coding gain against cooperative, non-cooperative, and threat signals. A combination time/code pilot is embedded within the waveform to empower optimization based on sub-carrier channel estimates. The waveform supports a broad range of adaptive/hybrid multiple access schemes including combinations of CDMA, TDMA, FDMA, and FHMA.

Adaptive Multi-Level Bandwidth-Efficient Coding and Modulation (BECM) provides a family of BECM schemes, incorporating both multi-constellation modulation and forward error-correction coding. A Low Density Parity-Check Code (LDPC) coded modulation family will be used to advance the state-of-the-art in bandwidth efficiency and adaptation capability. Adapting the modulation constellation, code rate, and code length to match the available spectrum and sub-carrier conditions will maximize spectral efficiency while meeting quality of service (QoS) and data rate needs.

Overall spectral efficiency depends on a combination of frequency, space, and time efficiency of spectrum use. As these factors are closely inter-dependent, improving efficiency in one area often reduces efficiency in another.

Decrease spectral use per call/connection
  increase modulation efficiency (bits/sec/Hz)
  improve error-correction coding efficiency
  compress source information
  use adaptive (i.e., hybrid) multiple-access technique with "soft" capacity limits (e.g., MC-CDMA where FDMA/CDMA is possible.

Increase spatial reuse of bandwidth
  increase power efficiency of modulation (minimum $E_b/N_o$ to achieve sufficient BER)
  use fast-adaptation in power control
  reduce sensitivity to interference by waveform design
  transmit a more "interference-friendly" waveform
  spread signal information over wider bandwidth
  increase directional sharing of bandwidth Increase temporal sharing of bandwidth
  coordinate time use of spectrum (e.g., via multiple access technique)
  seize temporal "holes" in spectrum use as they become available (e.g., fast signal acquisition, burst-by-burst adaptation)

Many of these strategies conflict with each other—increasing the modulation efficiency decreases power efficiency. An accurate assessment of overall spectral utilization efficiency requires consideration of the complex interaction of frequency/time/space reuse of the electromagnetic spectrum.

Referring to FIG. 1, there is illustrated a heteromorphic waveform function that dynamically "morphs" to fill unused spectrum "holes" to dramatically increase spectral utilization. Overall waveform adaptation can be considered a hierarchical combination of "internal" and "external" functions, features, and parameter sets that determine the final transmitted waveform. The "external" set provides a definition of the frequency and temporal opportunities, along with other environment characteristics. The definition of the "internal" set modifies how the waveform "reacts" within its overall bandwidth span to implement strategies that optimize the waveform parameters for maximum spectrum efficiency consistent with local channel conditions, mutual interference avoidance, and LPI/LPD requirements.

The waveform of the present invention is a multi-carrier direct-sequence spread-spectrum (MC-DS SS), multi-rate, multi-constellation composite wideband waveform, quickly adaptable in time, frequency, power, modulation type, rate, code, multi-carrier organization and access method. An adaptable interface will allow a variety of access and control techniques and will adapt to other networks in the same frequency allocation band and physical space, and to time-varying channel conditions, threats and user needs. The waveform uses available short-duration (milliseconds) time segments on a packet basis, relinquishing channels to other networks as they become active, and seizing other channels based on predicted availability.

Frequency agility is achieved in several ways. First, the center frequency and RF bandwidth of the waveform can vary to occupy different frequency channels as the time usage of those channels varies. This is shown in FIG. 2, which is a representation of spectrum utilization for four frequency channels as a function of time. The existing users areas indicate transmissions from existing non-XG users and the empty spectrum areas indicate "holes" in time-frequency spectrum use. Consider an XG transmission as shown utilizing the first available "gap" on frequency channel F1. At point A, the waveform demonstrates macroscopic frequency agility by "morphing" its center frequency and bandwidth span to briefly occupy both frequency channels F1 and F2 before morphing again into channel F2. At point B, both the non-XG and XG transmissions occupy frequency channel F2. The non-XG transmissions occupy only a portion of frequency channel F2. Within the full bandwidth span of the XG transmission, the waveform organizes its sub-carriers to occupy some subset of the full span. Hence, the occupied bandwidth of the waveform will be less than or equal to the full bandwidth span. This microscopic frequency agility is used to avoid the portions of the frequency channel occupied by the non-XG signals. No power, or power within an acceptable SIR value for the non-XG signals, is transmitted on these unused sub-carriers in order to avoid interference with other transmissions. This combination of macroscopic and microscopic frequency agility maximizes XG spectral efficiency by seizing available gaps in frequency/space/time freeing up needed spectrum for both communications and sensor (such as radar) functions.

Referring to FIG. 3, there is shown a representation of the waveform in 2-D on the left and in 3-D on the right. The legend in the center of the figure highlights the areas of unspread QAM-based modulation, empty spectrum, excluded spectrum, and DS-SS-based modulation. The excluded spectrum represents the combination of time-frequency holes that are not available for waveform use as provided by externally controlled functions within the XG radio. The waveform demonstrates microscopic frequency agility and organizes the signal energy to avoid these exclusion zones, "morphing" dynamically to assume varied shapes in 3-D (frequency, time, power). Note that the exclusion zones are displayed as "blocked out" in the 3-D representation; no power is transmitted on those time-frequency combinations. On other sub-carriers, the waveform utilizes a combination of QAM-based modulation and both single carrier and multi-carrier direct-sequence spread spectrum coexisting in time on different frequency sub-channels, with time-varying modulation on a given sub-channel. Bandwidth-efficient coding and modulation (BECM) schemes and sub-carrier organization are also continuously adapted to maximize overall spectral utilization efficiency. Based on signal optimization and data rate requirements, the XG waveform may choose to leave some of the available time-frequency holes empty.

Construction of the waveform is partitioned into two major functional components as described below.

Adaptive Multi-Carrier Organization and Signaling configures a channel of up to 250 MHz bandwidth span into one or many variable width sub-carriers that are independently modulated by Direct-Sequence Spread Spectrum (DS-SS) for variable coding gain. The waveform will support a broad range of multiple access techniques including CDMA, TDMA, FDMA, FHMA, CSMA/CA, and RTS/CTS. Multiple users are served simultaneously and uniquely at varying data rates on sub-channels contained within the up to 250 MHz bandwidth span.

Adaptive Multi-Level Bandwidth-Efficient Coding and Modulation (BECM) provides a family of BECM schemes, incorporating both multi-constellation modulation and multi-level forward error correction coding that is optimized for sub-channel conditions. The baseline design uses Lower Density Parity-Check Codes (LDPC), currently favored by recent research in BECM, as the basis for coded modulation technology.

Adaptation in multiple dimensions is required in order to realize improvements in spectral efficiency by utilizing gaps in frequency/space/time. The heteromorphic waveform is simultaneously adaptive across many different dimensions as summarized in Table 1. The carrier frequency, bandwidth span, and occupied bandwidth are varied giving the XG transmission the required macroscopic frequency agility to "hop" from channel to channel as needed. The adaptive multi-carrier organization and signaling capability structures the up to 250 MHz bandwidth span into one or many variable width sub-carriers to support microscopic frequency agility and avoid transmissions within the waveform bandwidth. The resulting occupied bandwidth will depend on a combination of user data rate requirements, sub-channel conditions, and the processing capability of the XG platform. Adaptive multi-level bandwidth-efficient coding and modulation (BECM) takes advantage of XG channel estimation enabled by pilot symbol elements embedded within the waveform to select error-correction codes and modulation constellations that optimize capacity across the sub-channels. In addition to power control schemes used to minimize multiple access interference, the waveform has a burst-by-burst "fast-adapt" power control capability to rapidly relinquish use of an individual sub-carrier or the entire occupied bandwidth, as indicated by an external control signal in response to detection of non-XG signals coincident in time/frequency/space.

TABLE 1

The Heteromorphic Waveform simultaneously adapts in multiple dimensions to increase spectral utilization efficiency.

| Adaptation Capability | Motivation | Discussion |
| --- | --- | --- |
| Carrier Frequency | Macroscopic Frequency Agility | Allows use of frequency/space/time "gaps: across full band of operation |
| Bandwidth Span | Macroscopic Frequency Agility | Allows use of different width frequency/space/time "gaps" |
| Sub-carrier Organization and Signaling (Occupied Bandwidth)) | Microscopic Frequency Agility | Avoids interference and jammers |
| Sub-carrier Bandwidth-Efficient Coding and Modulation (BECM) | Sub-channel Optimized Data Rates | Matches XG capacity to channel conditions |
| Fast-Adapt Power Control | Power Efficiency | Promotes spatial reuse by reducing interference to other users |
| Fast Acquisition/Pilot Symbols | Rapid Seize/Release and Channel Estimation | Allows use of short frequency/space/time "gaps" |

Figure 4:
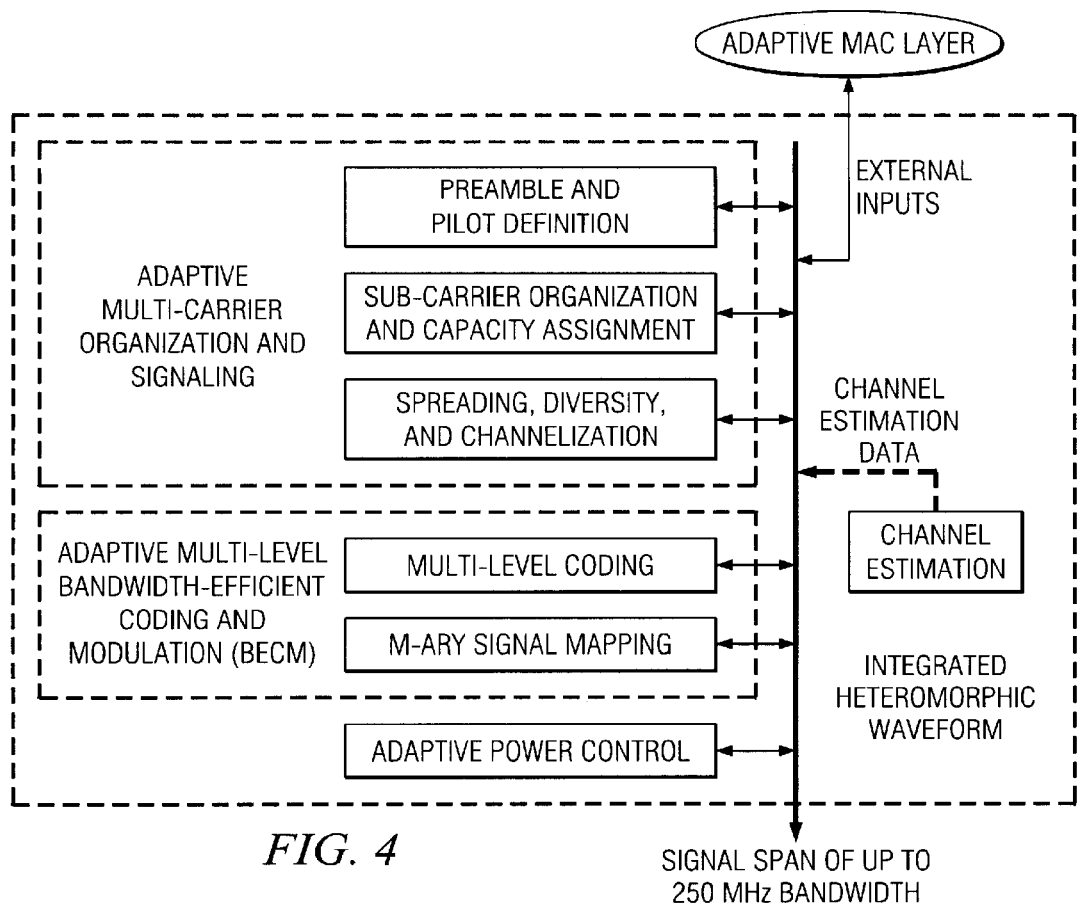
FIG. 4 is a multi-carrier organization, signaling and multi-level bandwidth-efficient coding and modulation for optimizing channel estimation data.

Referring to FIG. 4, there is illustrated a waveform adaptation function residing in an XG radio. The adaptive multi-carrier organization and signaling section defines the preamble and pilot symbols, assigns sub-carrier placement and capacity, and applies any needed PN spreading, time diversity, and channelization to the user data. The adaptive multi-level bandwidth-efficient coding and modulation section codes and maps the coded data to the assigned sub-carriers. The signal is then adaptively power controlled resulting in the complete heteromorphic waveform bandwidth spanning up to 250 MHz. Channel estimation on the received data is performed by using the bi-directional pilot symbols embedded in the waveform for each transmission to estimate the widely varying sub-carrier channel characteristics between any pair of XG nodes. A decoded preamble contains channel estimate information from the other end of the link. Channel estimation data are passed to each adaptation block to optimize sub-carrier capacity. In this way, the channel estimates drive the adaptation of the multi-carrier organization and signaling and multi-level bandwidth-efficient coding and modulation. The pilot symbol design for channel estimation is discussed later.

The multi-carrier structure of the heteromorphic waveform allows spatial processing technology to be applied independently across the different sub-bands. Hence, the waveform will not only be compatible with current and future spatial processing, but will enable performance improvements compared with techniques that yield one solution for the full bandwidth. This includes both beam and null forming and space/path diversity processing systems, leveraging the enhanced interference suppression and higher data rate transmission gains achieved across multiple technology areas to increase spectral efficiency.

Figure 5A:
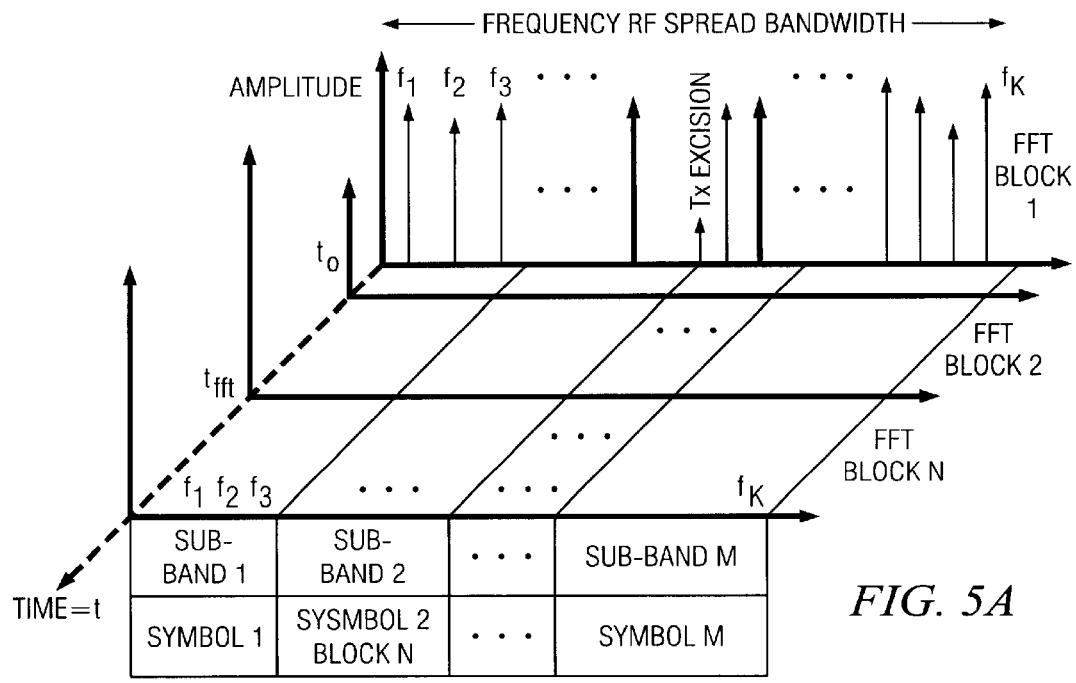
FIGS. 5A–5D, illustrates a representation of frequency/time/coding of a heteromorphic waveform in accordance with the present invention.

Referring to FIGS. 5A–5D, there is illustrated multiple 3-D frequency/time/power representations of the waveform. The x-y plane in FIG. 5A shows a time-frequency mapping of the waveform. User data are mapped across up to K multiple variable-width sub-carriers. Multiple sub-carriers can be aggregated to form variable width sub-bands within the total RF bandwidth. A FFT-based implementation is utilized with variable length integration time. The power level of each sub-carrier as a function of frequency and time can be made arbitrarily small to avoid overlapping with other transmissions in the environment. The waveform simultaneously supports multiple spreading widths and modulation formats on different sub-carriers.

Figure 5B:
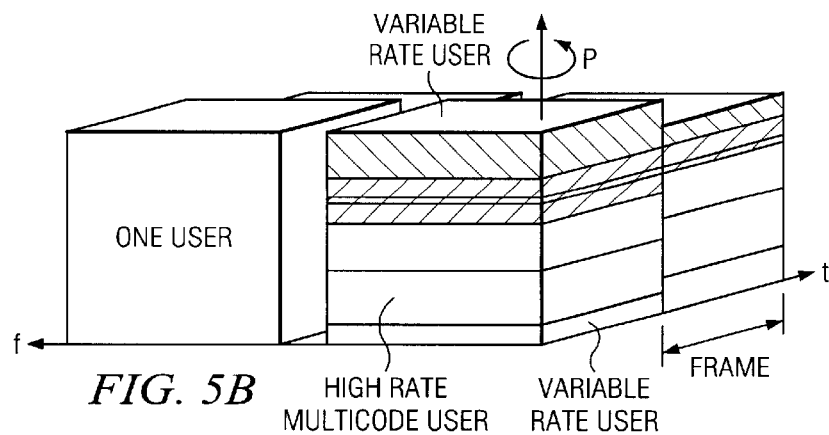
Figure 5C:
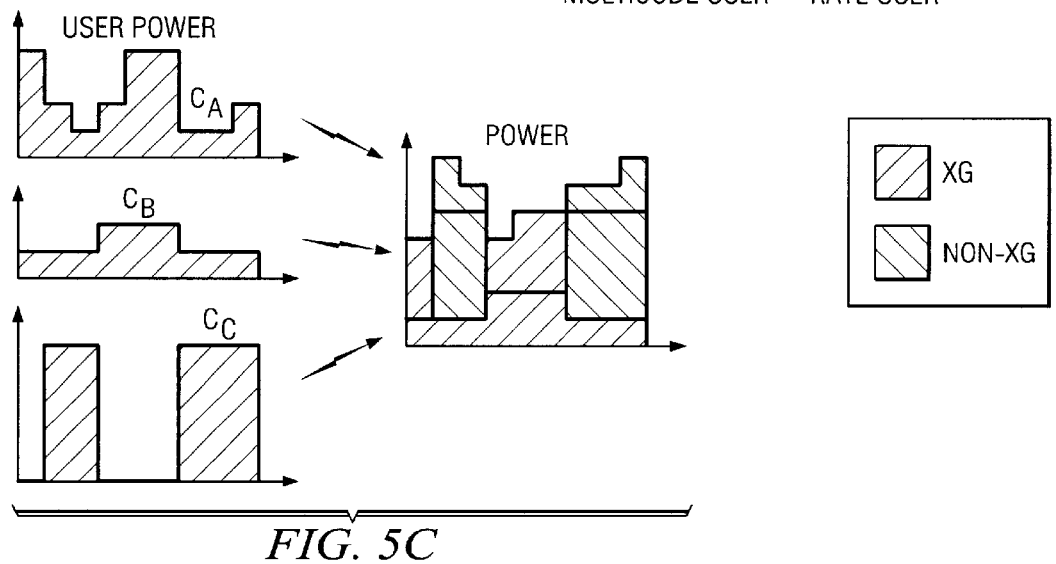
Figure 5D:
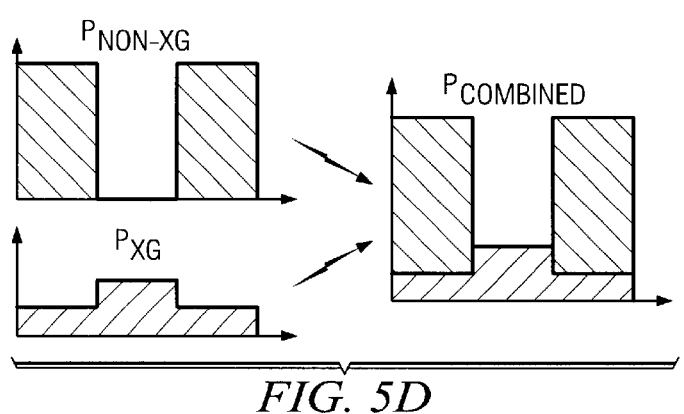

FIG. 5B shows a notional view of one way the waveform supports multiple users through CDMA. In FIG. 5B, one sub-carrier is dedicated to a single user by assigning a single, shorter PN spreading code to that user to increase the data rate, while on the other sub-carrier, multiple variable rate users access the channel with different length PN codes. This is further shown in FIG. 5C with the power of the codes of users CA, CB, and CC combining to form the aggregate power. Alternatively, one user can concentrate its data to occupy an entire sub-carrier using PSK/QAM-based modulation. The waveform also supports a hybrid mode where different portions of the user data are coded into different modulation formats as shown in FIG. 5D. Consider a non-XG transmission occupying the upper and lower portions of the frequency band.

Based on channel estimates provided by the waveform, the transmission shown is then mapped into two parts. Part 1 spreads the user data across the entire bandwidth in order to reduce the power spectral density below a level that is harmful to the non-XG transmission; part 2 concentrates the remaining data in the unoccupied bandwidth.

Across the bandwidth of a wideband signal, some frequencies will experience strong channel gains, while others experience deep fades. Both single carrier and MC-DS SS provides against narrowband interference and time-varying frequency-selective fading caused by the multipath propagation of the radio channel. For the single carrier case, when the bandwidth of a carrier exceeds the coherence bandwidth ($B_C$) of the channel, multiple rake receiver "fingers" are needed to resolve the individual multipath components and capture the achievable diversity gain. The number of components that can be resolved, and hence, the number of rake receivers needed, is the ratio of the carrier bandwidth to the coherence bandwidth. An alternate approach is to divide the total bandwidth B into N multiple sub-carriers of narrower bandwidth b=B/N, each roughly equal to the coherence bandwidth ($b \approx B_C$). With multiple carriers, the frequency diversity of the original wide bandwidth is retained by diversity combining the multiple independent carriers in the frequency domain instead of the multiple rake fingers of the single carrier in the time domain. The amount of frequency diversity gain can be traded against data rate in this type of waveform design by transmitting a given data symbol across multiple sub-carriers (i.e., spread in frequency) and combining the test statistics from those sub-carriers before making a final decision on the data. In the limit, as each sub-carrier is modulated by data independent of the other sub-carriers, the overall transmission rate is maximized, and each symbol is sent without frequency diversity.

It has been shown that the performance of a single carrier DS SS waveform with a rake receiver and an equivalent designed MC-DS SS waveform are similar.

When the available bandwidth (and the data rate) is much greater than the coherence bandwidth, then a large number of rake fingers are needed, significantly increasing receiver complexity. Instead of N (=$B/B_C$) fingers each processing a signal of bandwidth B for single carrier DS SS, the MC-DS SS waveform requires N fingers (one per sub-carrier) each processing a signal of bandwidth b (=B/N) resulting in a reduced complexity receiver. This occurs because the chip duration on the sub-carriers is M times longer than that of the single carrier system, reducing the number of computations needed to successfully demodulate the signal. When more than three to four rake fingers are needed, multi-carrier implementations are more efficient.

The implementation advantage of multi-carrier modulation is further highlighted when narrowband interferers are present since a multi-carrier system does not require a continuous frequency band. For application in XG systems, the multiple carriers are overlaid upon an existing set of narrowband signals simply by leaving appropriate gaps in the placement of the multiple sub-carriers. This adaptive "re-routing" of sub-carrier placement to avoid the interferers can be accomplished without performance loss relative to contiguous sub-carriers with the same total occupied bandwidth. A single-carrier signal must implement adaptive notch filters whose achievable notch depth and notch bandwidth are related in complexity.

An advantage of MC-DS SS waveform flexibility is using different data rates in some or all of the sub-carriers in order to send more data on "strong" sub-carriers while sending less data on "weak" ones. The ability to capitalize on this flexibility depends upon how accurately the system estimates the state of the fade on the different sub-carriers. The pilot performs this channel estimation where the ability to accurately estimate the fade depends upon many system parameters including signal-to-noise ratio (SNR), signal-to-interference ratio (SIR), Doppler spread, and forward error correction.

The waveform of the invention incorporates a channel estimation capability to guide adaptation of multi-carrier organization and signaling and bandwidth-efficient coding and modulation on a sub-carrier basis to optimize spectral utilization efficiency. The basis for channel estimation is a hybrid CDMA/TDMA pilot that consists of a spreading code embedded within the preamble of a data burst. These pilot symbols are logically equivalent to a training sequence for an adaptive equalizer. Use of a pilot allows coherent demodulation, improving power efficiency. Spreading the pilot reduces the probability of detection and intercept. Anti-jam resistance is provided by making sure that the pilot is spread at least as much as the data so that a jammer could not easily defeat the waveform by focusing efforts solely on the pilot.

The use of a pilot also provides a "snapshot" of sub-carrier fading that can be used to estimate the coherence bandwidth of the channel. This estimate is used as the basis for adapting sub-carrier width and placement subject to spectrum gap availability constraints. Just as sub-carrier width is driven by the coherence bandwidth of the channel, the rate of change of the fading is driven by the coherence time of the channel. The coherence time provides a measure of how long the channel estimates remain valid, and is inversely proportional to Doppler shift. For example, a vehicle moving at 50 mph and communicating on a frequency of 2.5 GHz has a Doppler shift of 186 Hz, indicating that channel estimates and subsequent multivariate adaptation will need to be updated on the order of every 5.4 ms. Data will be sent at the same rate on each sub-carrier when channel estimates are either not available, or whose ages have exceeded the coherence time of the channel.

Using the MC signal as the basis for multi-carrier organization and signaling gives a wide array of design trade-offs to maximize spectral efficiency. Multiple combinations of different waveform parameters provide an equivalent user payload data rate. The effectiveness of adaptation in multiple variables includes the following:

Variable bandwidth: varying the bandwidth span and occupied bandwidth allows the waveform to match the bandwidth available. Wider bandwidths provide a greater amount of raw capacity that can be traded for diversity, coding, spreading gain, etc. Narrower bandwidths provide a structure that allows waveform operation when small amounts of spectrum are available.

Variable number of sub-carriers: by varying the number of sub-carriers, the available bandwidth can be organized to avoid narrowband interference/jamming on select sub-carriers. If just one sub-carrier is used, the waveform "morphs" into a single carrier waveform (e.g., DS SS, conventional QPSK, etc.).

Variable sub-carrier organization: mapping user data into different combinations of sub-carriers allows different types of system gain to be applied to the signal to combat fading and interference. Spreading gain and frequency diversity gain can be applied across adjacent sub-carriers, and varying amounts of interference averaging can be achieved by mapping the data across non-contiguous sub-carriers.

Variable sub-carrier data rate: by monitoring the state of each sub-carrier, and using higher order modulation where channel conditions allow, the data rate within each sub-carrier can be optimized.

Variable frequency diversity: by transmitting multiple bits in parallel on different sub-carriers (multi-carrier load sharing), data rate is traded for frequency diversity.

Because of the severe sensitivity of any DS SS system to the near-far problem, one or more means of mitigation must be part of the system design. For ad-hoc wireless systems, the commercial cellular CDMA solution of base-station-oriented power control requires centralized control of all the transmitters. Alternatives to enhancing the waveform to near-far interference includes the following:

The XG capability of "morphing" the signal in frequency/space/time itself provides some inherent resistance to near-far interference. Adaptation strategies for multi-carrier organization and signaling and bandwidth-efficient coding and modulation consider the effects of near-far multiple access interference (MAI).

To seize and release spectrum opportunities, the data are organized into variable-length packets. This leads naturally into the ability to multiplex users based on packet arrival time. Hence, TDMA can be supported by the waveform for ad-hoc mobile networking.

Sub-carrier slots can be arranged to support FHMA with a near-orthogonal frequency-hopping (FH) pattern so that near-far signals typically occupy different sub-carriers at any instant in time.

Within the ad-hoc network, clusters of users arrange themselves in sub-networks, improving the effectiveness of standard power control.

When LPI is not required, a single-user MAI suppression technique based upon a receiver designed to minimize mean-square error can be employed. Such a receiver is well-suited for an ad-hoc network, since it does not require apriori knowledge of the parameters of any of the users in the system. However, short spreading sequences (i.e., those whose period equals the duration of a data symbol) are used.

When available, spatial processing provides additional near-far resistance with appropriate beamforming. In particular, sub-band beamforming is anticipated to provide greater amounts of near-far interference suppression.

The heteromorphic waveform described herein allows solution of the near-far problem through a combination of several techniques of adaptive frequency and/or time allocation, frequency hopping, power control or spatial arrays. Thus, the waveform will be compatible with TDMA, TSMA, FDMA, CDMA, FHMA and other commonly used supplemental control techniques such as CSMA/CA and RTS/CTS. For integration as an appliqué solution, the waveform utilizes the multiple access scheme of the base radio system if necessary, or adapt it if allowed. Hybrid multiple access schemes can be used that dynamically match the multiple access format to the local spectrum utilization characteristics leading to even further increases in spectrum utilization.

Error-correction codes are well known to provide significantly increased power efficiency for a small (or no) reduction in bandwidth efficiency at the expense of increased complexity. The baseline error-correction coding and modulation design is based on an adaptive low-density parity-check coded (LDPC) modulation code family that is well-suited for use in XG systems.

LDPC codes are linear binary block codes whose parity-check matrix H possesses a low density of ones (i.e., it consists mostly of zeros). These characteristics endow the codes with an improved weight spectrum and a simple near-optimum decoding algorithm. The decoding algorithm is iterative, much like the trellis-turbo decoding algorithm, but the LDPC algorithm iterates over a graph rather than between two trellises. Note that although for TTCM the two trellises can be put in graph form, the graph is much more complex than the LDPC graph. The described LDPC modulation family enables fast adaptation by the following techniques:

The use of a multi-level encoding structure, which is a natural architecture for multi-rate coding Simple component encoder implementation via simple shift-register circuits through the use of cyclic and quasi-cyclic LDPC codes The heteromorphic waveform of the present invention will incorporate a range of code lengths and code rates to optimize performance based on spectrum availability and sub-carrier channel conditions.

Figure 6:
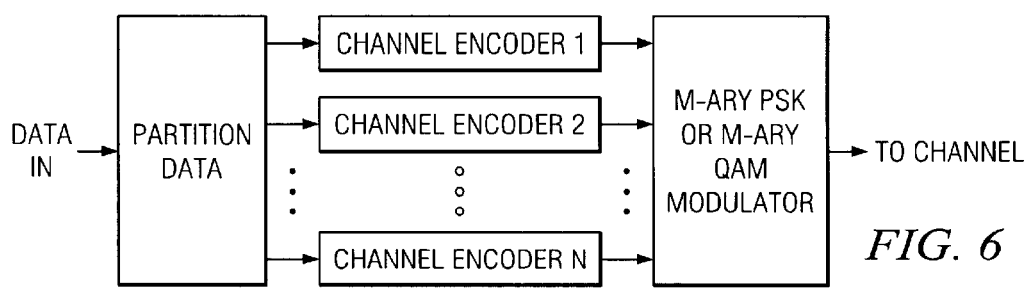
FIG. 6 is a block diagram illustration of multi-level configuration of LDPC-based coded modulation scheme to facilitate rapid adaptation of code parameters.

Referring to FIG. 6, there is illustrated binary LDPC codes arranged in a multi-level configuration, consisting of N component codes and a mapper (modulator). By this approach, the bandwidth efficiency (and bandwidth) can be widely varied by varying the code rates of the component codes and/or the constellation size of the mapper. This multi-level configuration gives near-capacity performance. The number of levels is generally matched to the constellation size. For a $2^N$-ary constellation, there will be N encoders.

Encoders for cyclic LDPC codes can be constructed using the well-known shift-register circuits used to encode BCH codes. The nominal codeword length is n and the nominal data word length is k giving a nominal code rate of k/n with these parameters easily modified. Low-latency adaptation will need a range of code lengths.

Using LDPC code families as the basis for bandwidth-efficient coding and modulation gives a wide array of trade-offs to maximize spectral efficiency. Multiple combinations of modulation constellation and code rate provide an equivalent user payload data rate, and code length will also impact error performance. The effectiveness of adaptation in multiple variables includes the following:

Modulation constellation: varying the modulation constellation provides the capability to trade-off raw data (rate for power efficiency. Small modulation constellations allow operation at lower receive power levels to extend coverage range. Larger modulation constellations (up to 64 QAM) give larger raw capacity that can then be traded for coding gain to match sub-carrier channel conditions.

Code rate: varying code rate provides an additional degree of freedom to match code strength to local channel conditions. Low rate codes help extend link margin and high rate codes will deliver an appropriate amount of coding gain while maximizing user data rate.

Code length: variable code lengths are needed to efficiently map user data into a wide range of sub-carrier capacities. Long codes will be used to operate near the capacity limit when long temporal "gaps" in spectrum are available. Short codes will be used to meet low latency requirements, provide fast adaptation, and allow the waveform to seize short/small spectrum gaps.

Multi-level coding: using multi-level coding simplifies the coding and decoding architecture and is a natural fit for supporting adaptive coding strategies by "pre-filling" multiple user data blocks so that it is ready for immediate transmission once channel estimation data are available to guide code selection.

The combination of a wideband MC-DS SS waveform structure that can dynamically change carrier frequency, bandwidth, and sub-carrier organization and signaling with bandwidth-efficient coding and modulation is used to create a heteromorphic waveform. Waveform architecture has been structured to innovate beyond the current state-of-the-art in wireless communications and information theory research. This invention extends the boundaries by adapting to fill available spectrum "holes" and optimizing user data rate on available sub-carriers using simultaneous multivariate adaptation of waveform parameters.

Although a preferred embodiment of the invention has been illustrated in the accompanying drawings and described in the foregoing description, it will be understood that the invention is not limited to the embodiments disclosed, but is capable of numerous rearrangements and modifications of parts and elements without departing from the spirit of the invention.

What is claimed is:

1. A system for generating an adaptive air interface waveform, the system comprising:

an adaptive multi-carrier organization and signaling component operable to generate a waveform having a multi-carrier organization comprising a variable carrier frequency and variable bandwidth signal that comprises one or more subcarriers that are dynamically placeable over a range of frequencies, each subcarrier being separately modulated according to a direct sequence (DS) spread spectrum (SS) modulation technique, the waveform having an embedded pilot usable to optimize one or more spectrum efficiencies of the waveform; and an adaptive multi-level bandwidth-efficient coding and modulation (BECM) component receive the waveform from the adaptive multi-carrier organization and signaling component, the BECM component operable to adapt a modulation constellation, a code rate, and a code length of the waveform according to an available spectrum and one or more varying conditions of the subcarrier in order to provide the waveform as the adaptive air interface waveform.

2. The system of claim 1, wherein the waveform is a heteromorphic waveform operable to dynamically adapt with respect to one or more of frequency, time, modulation, code, data rate, power, signaling, and multi-carrier organization.

3. The system of claim 1, wherein the range of frequencies spans approximately 250 MHz.

4. The system of claim 1, wherein the waveform is operable to use one or more unused holes in a spectrum defined by one or more of frequency, space, and time.

5. The system of claim 1, wherein the waveform supports a plurality of multiple access (MA) modulation techniques.

6. The system of claim 5, wherein the plurality of MA modulation techniques comprises:
one or more carrier division multiple access (CDMA) modulation techniques;
one or more time division multiple access (TDMA) modulation techniques;
one or more frequency division multiple access (FDMA) modulation techniques;
one or more frequency-hopped multiple access (FHMA) modulation techniques.

7. The system of claim 5, wherein at least one of the MA modulation techniques is a hybrid MA modulation technique that combines two or more different conventional modulation techniques.

8. The system of claim 1, wherein the BECM uses a low-density parity-check (LDPC) code modulation technique to adapt the modulation constellation, the code rate, and the code length of the waveform.

9. The system of claim 1, wherein the BECM is operable to adapt the modulation constellation, the code rate, and the code length of the waveform according to one or more quality of service (QoS) requirements and one or more data rate requirements for signal transport, in addition to the available spectrum and one or more varying conditions of the subcarrier.

10. The system of claim 1, wherein the waveform exhibits both macroscopic frequency agility and microscopic frequency agility.

11. A method for generating an adaptive air interface waveform, the method comprising:
generating a waveform having a multi-carrier organization comprising a variable carrier frequency and variable bandwidth signal that comprises one or more subcarrier that are dynamically placeable over a range of frequencies, each subcarrier being separately modulated according to a direct sequence (DS) spread spectrum (SS) modulation technique, the waveform having an embedded pilot usable to optimize one or more spectrum efficiencies of the waveform; and
adapting a modulation constellation, a code rate, and a code length of the waveform according to an available spectrum and one or more varying conditions of the subcarrier in order to provide the waveform as the adaptive air interface waveform.

12. The method of claim 11, wherein the waveform is a heteromorphic waveform operable to dynamically adapt with respect to one or more of frequency, time, modulation, code, data rate, power, signaling, and multi-carrier organization.

13. The method of claim 11, wherein the range of frequencies spans approximately 250 MHz.

14. The method of claim 11, wherein the waveform is operable to use one or more unused holes in a spectrum defined by one or more of frequency, space, and time.

15. The method of claim 11, wherein the waveform supports a plurality of multiple access (MA) modulation techniques.

16. The method of claim 15, wherein the plurality of MA modulation techniques comprises:
one or more carrier division multiple access (CDMA) modulation techniques;
one or more time division multiple access (TDMA) modulation techniques;
one or more frequency division multiple access (FDMA) modulation techniques;
one or more frequency-hopped multiple access (FHMA) modulation techniques.

17. The method of claim 15, wherein at least one of the MA modulation techniques is a hybrid MA modulation technique that combines two or more different conventional modulation techniques.

18. The method of claim 11, wherein a low-density parity-check (LDPC) code modulation technique is used to adapt the modulation constellation, the code rate, and the code length of the waveform.

19. The method of claim 11, wherein the modulation constellation, the code rate, and the code length of the waveform is adapted according to one or more quality of service (QoS) requirements and one or more data rate requirements for signal transport, in addition to the available spectrum and one or more varying conditions of the subcarrier.

20. The method of claim 11, wherein the waveform exhibits both macroscopic frequency agility and microscopic frequency agility.

21. Software for generating an adaptive air interface waveform, the software embodied in media and when executed operable to:
generate a waveform having a multi-carrier organization comprising a variable carrier frequency and variable bandwidth signal that comprises one or more subcarriers that are dynamically placeable over a range of frequencies, each subcarrier being separately modulated according to a direct sequence (DS) spread spectrum (SS) modulation technique, the waveform having an embedded pilot usable to optimize one or more spectrum efficiencies of the waveform; and
adapt a modulation constellation, a code rate, and a code length of the waveform according to a available spectrum and one or more varying conditions of the subcarrier in order to provide the waveform as the adaptive air interface waveform.

22. The software of claim 21, wherein the waveform is a heteromorphic waveform operable to dynamically adapt with respect to one or more of frequency, time, modulation, code, data rate, power, signaling, and multi-carrier organization.

23. The software of claim 21, wherein the range of frequencies spans approximately 250 MHz.

24. The software of claim 21, wherein the waveform is operable to use one or more unused holes in a spectrum defined by one or more of frequency, space, and time.

25. The software of claim 21, wherein the waveform supports a plurality of multiple access (MA) modulation techniques.

26. The software of claim 25, wherein the plurality of MA modulation techniques comprises:
one or more carrier division multiple access (CDMA) modulation techniques;
one or more time division multiple access (TDMA) modulation techniques;
one or more frequency division multiple access (FDMA) modulation techniques;
one or more frequency-hopped multiple access a (FHMA) modulation techniques.

27. The software of claim 25, wherein at least one of the MA modulation techniques is a hybrid MA modulation technique that combines two or more different conventional modulation techniques.

28. The software of claim 21, wherein a low-density parity-check (LDPC) code modulation technique is used to adapt the modulation constellation, the code rate, and the code length of the waveform.

29. The software of claim 21, wherein the modulation constellation, the code rate, and the code length of the waveform is adapted according to one or more quality of service (QoS) requirements and one or more data rate requirements for signal transport, in addition to the available spectrum and one or more varying conditions of the subcarrier.

30. The software of claim 21, wherein the waveform exhibits both macroscopic frequency agility and microscopic frequency agility.

31. A system for generating an adaptive air interface waveform, the system comprising:

means for generating a waveform having a multi-carrier organization comprising a variable carrier frequency and variable bandwidth signal that comprises on or more subcarriers that are dynamically placeable over a range of frequencies, each subcarrier being separately modulated according to a direct sequence (DS) spread spectrum (SS) modulation technique, the waveform having an embedded pilot usable to optimize one or more spectrum efficiencies of the waveform; and means for receiving the waveform from the means for generating the waveform and adapting a modulation constellation, a code rate, and a code length of the waveform according to an available spectrum and one or more varying conditions of the subcarrier in order to provide the waveform as the adaptive air interface waveform.

* * * * *

UNITED STATES PATENT AND TRADEMARK OFFICE
CERTIFICATE OF CORRECTION

PATENT NO. : 6,847,678 B2
APPLICATION NO. : 10/421168
DATED : January 25, 2005
INVENTOR(S) : Berezdivin et al.

Page 1 of 1

It is certified that error appears in the above-identified patent and that said Letters Patent is hereby corrected as shown below:

<u>Column 11:</u>
Line 65, before "rate" delete "(".

<u>Column 13:</u>
Line 10, before "techniques" delete "modulation".
Line 51, after "the waveform as" delete "the" and insert -- an --.
Line 67, before "techniques" delete "modulation".

<u>Column 14:</u>
Line 21, after "in addition to" delete "the" and insert -- an --.
Line 43, after "the waveform as" delete "the" and insert -- an --.
Line 59, before "techniques" delete "modulation".

<u>Column 15:</u>
Line 13, after "in addition to" delete "the" and insert -- an --.

<u>Column 16:</u>
Line 3, after "comprises" delete "on" and insert -- one --.
Line 16, after "the waveform as" delete "the" and insert -- an --.

Signed and Sealed this

First Day of May, 2007

JON W. DUDAS
*Director of the United States Patent and Trademark Office*